(12) United States Patent
Ting et al.

(10) Patent No.: US 12,356,587 B2
(45) Date of Patent: Jul. 8, 2025

(54) MANIFOLD, RACK AND DATA CENTER COOLING SYSTEM

(71) Applicant: Fulian Precision Electronics (Tianjin) Co., LTD., Tianjin (CN)

(72) Inventors: Yu-Chia Ting, Neihu (TW); Tsung-Lin Liu, Neihu (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 201 days.

(21) Appl. No.: 18/208,783

(22) Filed: Jun. 12, 2023

(65) Prior Publication Data

US 2024/0147660 A1 May 2, 2024

(30) Foreign Application Priority Data

Oct. 27, 2022 (CN) .......................... 202211326240.1

(51) Int. Cl.
*H05K 7/20* (2006.01)

(52) U.S. Cl.
CPC ..... *H05K 7/20272* (2013.01); *H05K 7/20781* (2013.01)

(58) Field of Classification Search
CPC .................. H05K 7/20272; H05K 7/20781
See application file for complete search history.

(56) References Cited

U.S. PATENT DOCUMENTS

| | | | | |
|---|---|---|---|---|
| 7,450,385 B1 * | 11/2008 | Campbell | .......... | H05K 7/20781 361/689 |
| 9,354,676 B2 * | 5/2016 | Shelnutt | ............. | H05K 7/20781 |
| 10,164,373 B1 * | 12/2018 | Cheon | ................ | H05K 7/20781 |
| 10,701,838 B1 * | 6/2020 | Conroy | ............. | H05K 7/20781 |
| 10,863,652 B1 * | 12/2020 | Conroy | ............. | H05K 7/20763 |
| 10,921,070 B2 * | 2/2021 | Chen | ................. | H05K 7/20272 |
| 11,064,628 B2 * | 7/2021 | Thibaut | ............ | H05K 7/20772 |
| 11,553,627 B1 * | 1/2023 | Gregory | ............ | H05K 7/20781 |
| 11,856,724 B2 * | 12/2023 | Thibaut | ............... | H05K 7/1452 |
| 11,898,674 B2 * | 2/2024 | Yang | ................. | H05K 7/20781 |
| 12,063,755 B2 * | 8/2024 | Yang | ................. | H05K 7/20781 |
| 12,200,905 B2 * | 1/2025 | Wang | ................ | H05K 7/20709 |

OTHER PUBLICATIONS

FWondimu et al., "White Paper: Guidelines to Rack Manifold Requirements and Qualification", Open Compute Project, Oct. 2023 (Year: 2023).*

* cited by examiner

*Primary Examiner* — Robert J Hoffberg
(74) *Attorney, Agent, or Firm* — ScienBiziP, P.C.

(57) ABSTRACT

A manifold for cooling server includes an inlet pipe, an outlet pipe, a plurality of first hole groups, and a plurality of second hole groups. The distance between every two adjacent first hole groups is first distance, the distance between every two adjacent second hole groups is second distance, and the first distance is not equal to the second distance. The first distance is designed for one size of server, and the second distance is designed for another size of server. When changing the size of all servers in the rack, turning manifold 100 to 180 degrees to change the first hole groups 30 to the second hole groups 40 for adapting the severs, which makes the manifold 100 adapt two different sizes of server. A rack and a data center cooling system using the manifold are also disclosed.

18 Claims, 7 Drawing Sheets

MANIFOLD, RACK AND DATA CENTER COOLING SYSTEM

FIELD

The subject matter herein generally relates to cooling of servers in rack, and to a manifold for cooling servers with a rack and a data center cooling system.

BACKGROUND

In rack cooling, since there are multiple layers in the rack and servers installed on each layer, manifolds are usually used in the rack to cool the servers on each layer. The manifolds are arranged vertically and have water inlets and water outlets at corresponding positions on each layer. The water inlet and the water outlet are inserted into the circulation loop of the server itself for cooling the server. However, a size of a traditional manifold is usually fixed, when changing the layer height of the rack for a different size of a server, the manifold may not fit the positions of the water inlet and water outlet of the different server.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one".

The term "comprising" means "including, but not necessarily limited to"; it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

Figure 1:
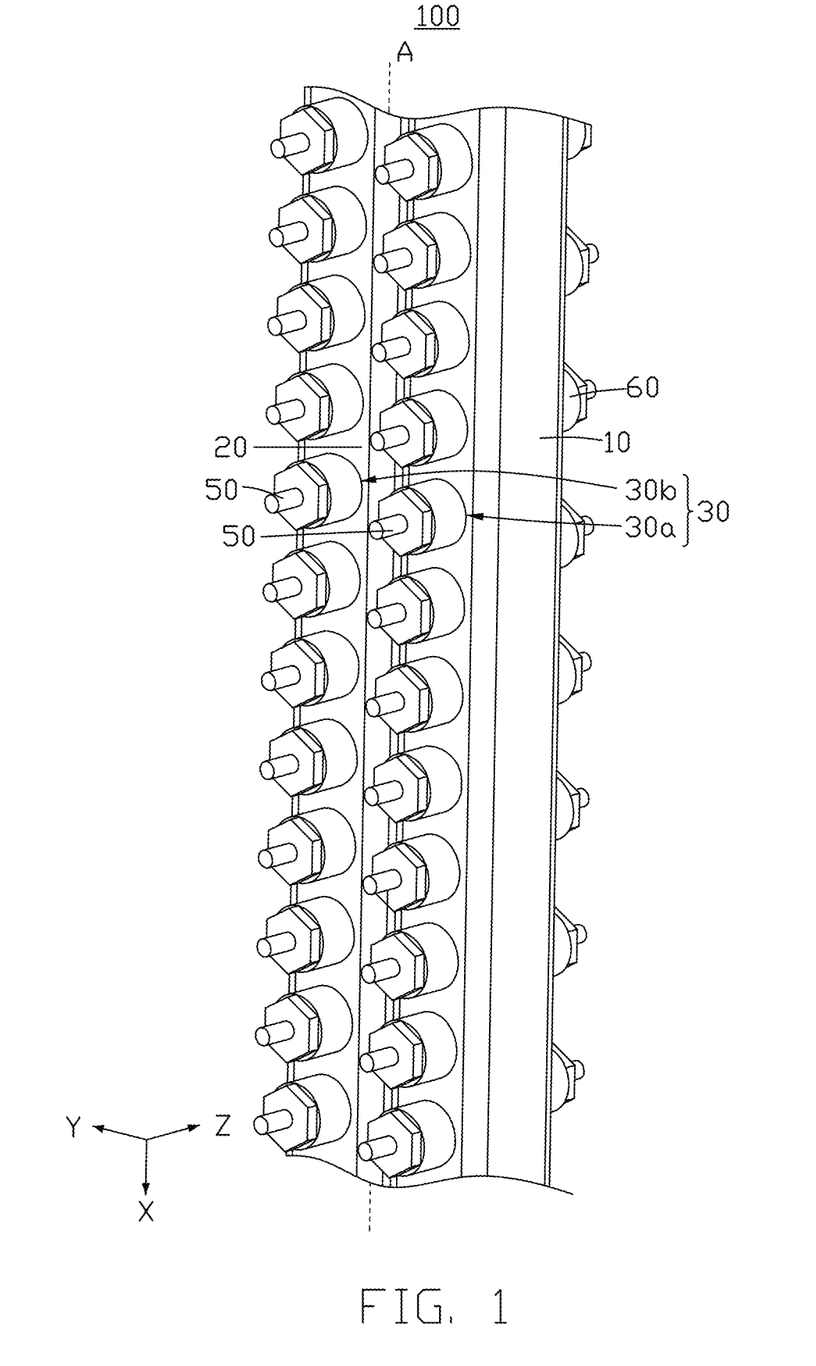
FIG. 1 is an isometric view of a manifold according to an embodiment of the present disclosure.
Figure 2:
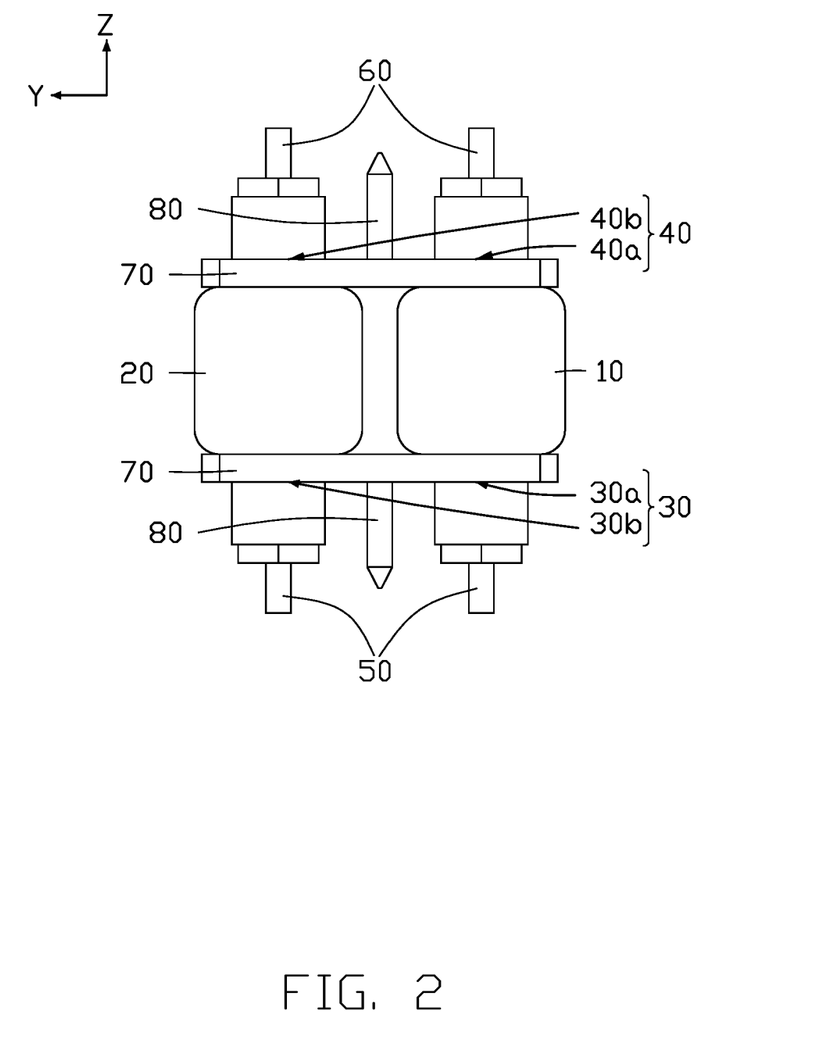
FIG. 2 is a top plan view of the manifold of FIG. 1.
Figure 3:
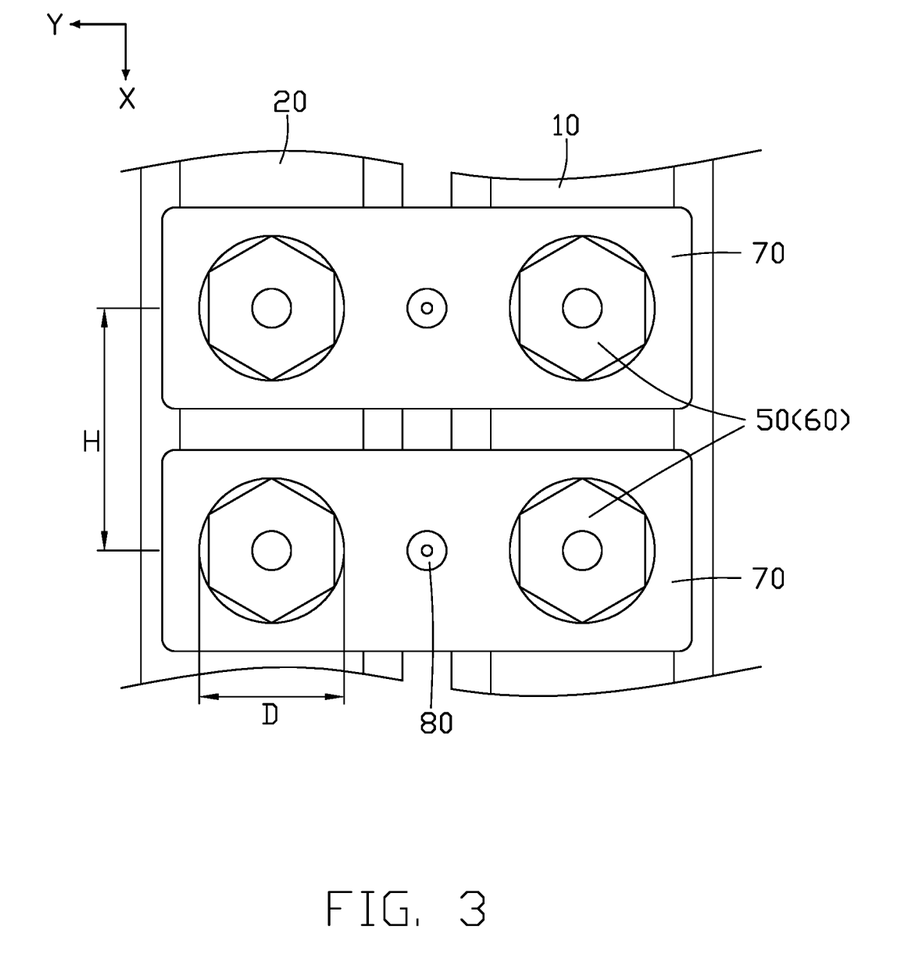
FIG. 3 is a front elevation view of the manifold of FIG. 1.

As shown in FIG. 1 to FIG. 3, a manifold 100 for cooling servers in a rack in one embodiment includes an inlet pipe 10 and an outlet pipe 20. The rack has multiple layers and each layer is equipped with a server. The server can be a processor or a storage device. The manifold 100 is used to deliver and recycle cooling water to the servers of each layer, for cooling of the servers of each layer.

The inlet pipe 10 and the outlet pipe 20 are arranged side by side. The inlet pipe 10 is used to deliver cooling water to the server. The outlet pipe 20 is used to recover the hot water flowing from the server. The length of the inlet pipe 10 is extended along the first direction (X direction). The outlet pipe 20 is parallel to the inlet pipe 10 and located on one side of the inlet pipe 10 along the second direction (Y direction). The second direction is substantially perpendicular to the first direction. In some embodiments, the inlet pipe 10 and the outlet pipe 20 are both vertically arranged inside the rack.

The manifold 100 has a plurality of first hole groups 30 and a plurality of second hole groups 40. The first hole groups 30 and the second hole groups 40 are respectively arranged on opposite sides of the inlet pipe 10 and the outlet pipe 20 along the third direction (Z direction). The third direction is substantially perpendicular to the first direction and the second direction. One side of inlet pipe 10 and outlet pipe 20 is all first hole group 30, and the other side of inlet pipe 10 and outlet pipe 20 is all second hole group 40. Each first hole group 30 includes a first inlet 30a and a first outlet 30b. The first inlet 30a is located on the inlet pipe 10. The first outlet 30b is located on the outlet pipe 20. Each second hole group 40 includes a second inlet 40a and a second outlet 40b. The second inlet 40a is located on the inlet pipe 10, and the second outlet 40b is located on the outlet pipe 20. Along the X direction, the distance H between every two adjacent first hole groups 30 or every two adjacent second hole groups 40 is the same. The distance between every two adjacent first hole groups 30 is the first distance, the distance between every two adjacent second hole groups 40 is the second distance, and the first distance is not equal to the second distance. The first distance is designed for one size of server, and the second distance is designed for another size of server. When changing the size of all servers in the rack, turning manifold 100 to 180 degrees to change the first hole groups 30 to the second hole groups 40 for adapting the severs, and when changing the size of all servers back in the rack, turning manifold 100 back to 180 degrees to change the second hole groups 40 to the first hole groups 30, which makes the manifold 100 adapt two different sizes of server.

In some embodiments, the first distance is 1RU (one rack unit) of the standard specification, which is 44.45 mm. The second distance is 1OU (one open unit) of another standard specification, which is 48 mm. When the specifications of each layer in the rack are the standard size of RU, using the side of the manifold 100 with the first hole group 30. When the specifications of each layer in the rack are the standard size of the OU, using the side of the manifold 100 with the second hole group 40. When the height of the rack changes, the manifold 100 does not need to be replaced, it can be used only by turning the manifold 100 to 180 degrees, which improves the applicability and convenience of the manifold 100 and the rack.

In some embodiments, both the inlet pipe 10 and the outlet pipe 20 are square tubes.

In other embodiments, the distance between two adjacent first hole groups 30 and the distance between two adjacent second hole groups 40 can also be different, and can be formulated according to the needs of the rack.

In some embodiments, both the first inlets 30a and the first outlets 30b have a first diameter. Both the second inlets 40a and the second outlets 40b have a second diameter. The first diameter is equal to or not equal to the second diameter. The manifold 100 also includes a plurality of first joints 50 and a plurality of second joints 60. Each first inlet 30a and each first outlet 30b are connected to a first joint 50, and the size of the first joint 50 matches the first diameter. Each second inlet 40a and each second outlet 40b is connected to a second joint 60, and the size of the second joint 60 matches the second diameter. The first joint 50 and the second joint 60 are used to insert into the interface of the server to deliver water. As an example, since the interface of the server generally has two different standard sizes, each standard size interface corresponds to a size D of a joint, so the first joint 50 and the second joint 60 are respectively used to adapt to the two standard sizes.

Figure 5:
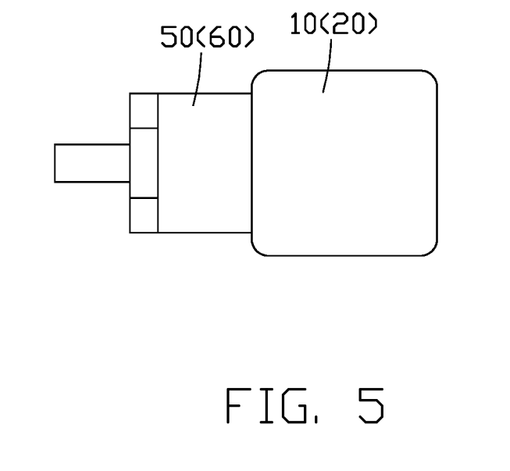
FIG. 5 is a top plan view of an embodiment of a first joint and an embodiment of an inlet pipe of the present disclosure.
Figure 6:
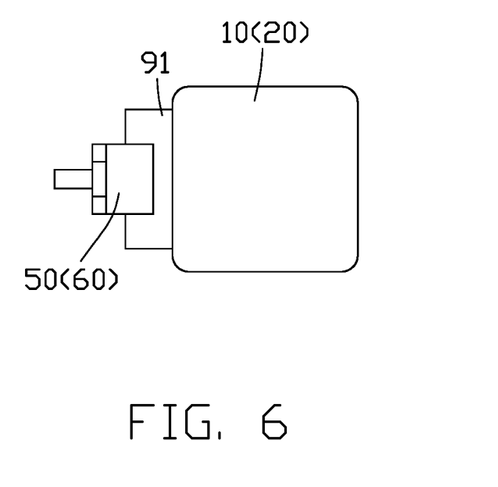
FIG. 6 is a top plan view of an embodiment of a second joint, an embodiment of a first adapter and another embodiment of an inlet pipe of the present disclosure.

As shown in FIG. 5 to FIG. 6, when the first diameter is not equal to the second diameter, that is, when the first joint 50 and the second joint 60 have different sizes, the manifold 100 further includes a first adapter 91. The outer diameter of the first adapter 91 is equal to the larger one of the first diameter and the second diameter, and the inner diameter of the first adapter 91 is equal to the smaller one of the first diameter and the second diameter. Specifically: if the first joint 50 is larger and the second joint 60 is smaller, at this time, if the smaller second joint 60 needs to be installed on the first inlet 30a and first outlet 30b, first adapter 91 needs to be installed on the first inlet 30a and first outlet 30b, and then install the second joint 60 to the first adapter 91, as shown in FIG. 6. The purpose of installing the small joint to the large mouth is realized, making the small joint more versatile, and improving convenience and applicability.

Figure 7:
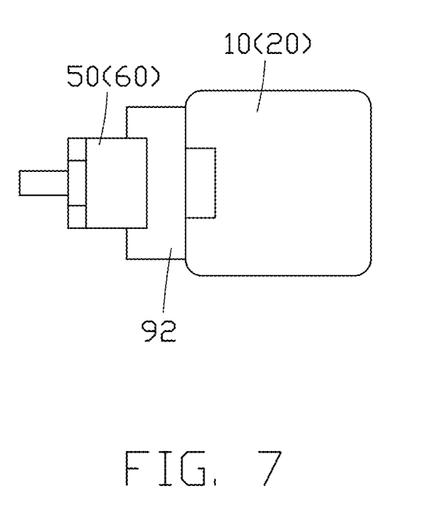
FIG. 7 is a top plan view of another embodiment of a second joint and another embodiment of an outlet pipe of the present disclosure.
Figure 8:
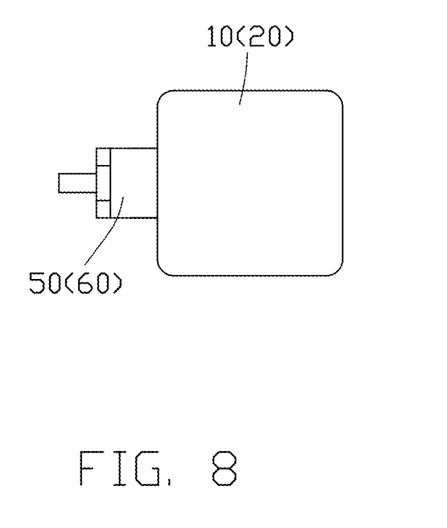
FIG. 8 is a top plan view of another embodiment of a first joint, embodiment of a second adapter and another embodiment of an outlet pipe of the present disclosure.

As shown in FIG. 7 to FIG. 8, when the first diameter is not equal to the second diameter, that is, when the first joint 50 and the second joint 60 are not the same size, the manifold 100 also includes a second adapter 92. The outer diameter of the second adapter 92 is equal to the smaller one of the first diameter and the second diameter, and the inner diameter of the second adapter 92 is equal to the larger one of the first diameter and the second diameter. Specifically: if the first joint 50 is larger and the second joint 60 is smaller, at this time, if the larger first joint 50 needs to be installed on the second inlet 40a and second outlet 40b, the second adapter 92 needs to be installed on the second inlet first 40a and second outlet 40b, and then install the first joint 50 to the second adapter 92, as shown in FIG. 6b. The purpose of installing the large joint to the small opening is realized, making the large joint more versatile, and also improving the convenience and applicability.

When the first diameter is equal to the second diameter, the first joint 50 and the second joint 60 are the same.

Figure 4:
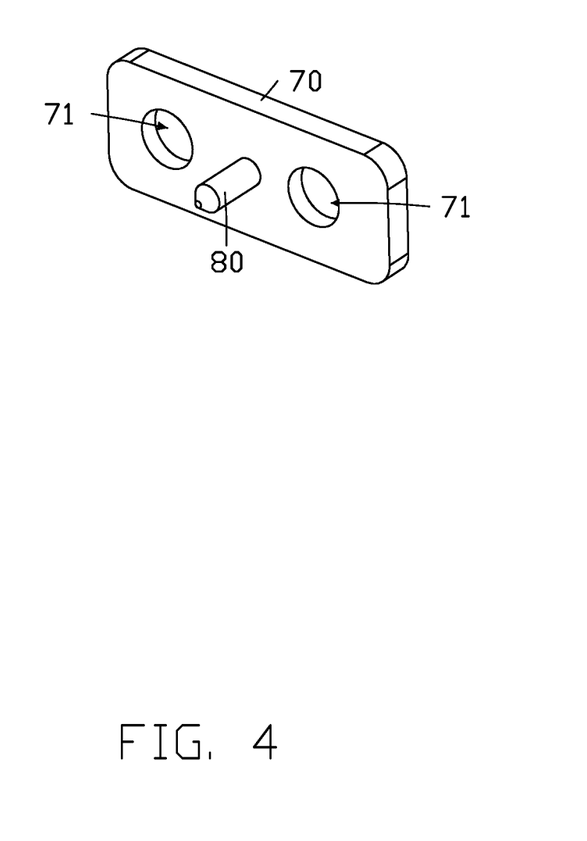
FIG. 4 is an isometric view of a connecting piece according to an embodiment of the present disclosure.

As shown in FIG. 4, in some embodiments, when the distance between the inlet pipe 10 and the outlet pipe 20 is relatively close, for example, when the distance between the inlet pipe 10 and the outlet pipe 20 is smaller than the diameters of the inlet pipe 10 and the outlet pipe 20, the manifold 100 also includes a plurality of connecting pieces 70. Each connecting piece 70 is used to connect two first joints 50 or two second joints 60 adjacent along the Y direction. Each connecting piece 70 has two holes 71. The hole 71 is used to pass through two adjacent first joints 50 or two adjacent second joints 60. The connecting piece 70 is used to fix the position between two adjacent first joints 50 or two adjacent second joints 60, making the overall structure of the manifold 100 more stable.

Furthermore, in some embodiments, each connecting piece 70 has a guide pin 80 on a side away from the inlet pipe 10 and the outlet pipe 20. The guide pin 80 extends along the Y direction and is located on the middle of the two holes 71. The guide pin 80 is used to insert into the guide hole of the server, so that the first joint 50 and second joint 60 can be smoothly inserted into the interface of the server to avoid misalignment.

Figure 9:
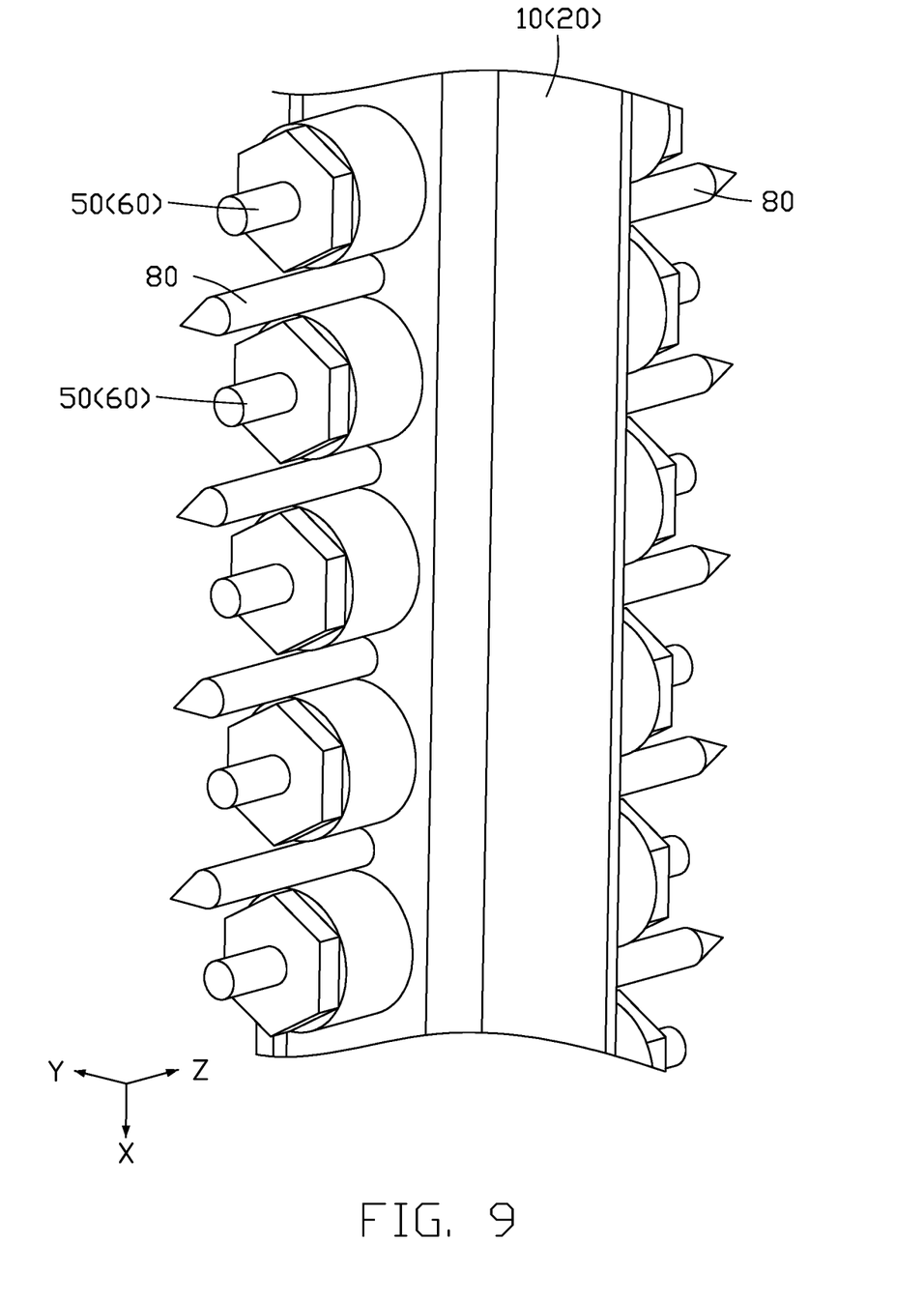
FIG. 9 is an isometric view of another embodiment of an outlet pipe and another embodiment of an inlet pipe of the present disclosure.

As shown in FIG. 9, in some other embodiments, when the distance between the inlet pipe 10 and the outlet pipe 20 is relatively long, for example, the inlet pipe 10 and the outlet pipe 20 are respectively arranged on both sides of the rack, at this time, along the X direction, a guide pin 80 is provided between every two adjacent first joint 50 or second joint 60. The guide pin 80 also extends in the Y direction for guidance.

In some embodiments, the rack further includes a body and a swivel joint (not shown in FIGs). The swivel joint is arranged on the body. The inlet pipe 10 and the outlet pipe 20 are connected to one end of the rotary joint. The other end of the swivel joint extends out of the body to connect to a cooler. The axis A of rotation of the swivel joint is parallel to the X direction. The manifold 100 can rotate relative to the body around the axis A of the swivel joint, so as to turn the manifold 100 over.

In some embodiments, the manifold 100 is arranged symmetrically along the rotation axis A of the swivel joint and the XZ plane.

A data center cooling system for cooling servers in one embodiment includes a cooler, a cooling water input pipe, a hot water output pipe and racks with manifold 100. The swivel joint of each rack connects the cooling water input pipe and the hot water output pipe. The inlet pipe 10 is connected to the cooling water input pipe. The outlet pipe 20 is connected to the hot water output pipe. The cooler is used to cool the water in the hot water output pipe and circulate it to the cooling water input pipe.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A manifold configured for liquid cooling comprising:
   an inlet pipe extended along a first direction;
   an outlet pipe parallel to the inlet pipe and located on one side of the inlet pipe in a second direction, the second direction substantially perpendicular to the first direction;
   a plurality of first hole groups arranged along the first direction at an interval of a first distance therein between; and
   a plurality of second hole groups arranged along the first direction at an interval of a second distance therein between, the second distance being unequal to the first distance;
   wherein each one group of the plurality of first hole groups includes a first inlet and a first outlet, each one group of the plurality of second hole groups includes a second inlet and a second outlet, the first inlets and the second inlets are located on the inlet pipe, the first outlets and the second outlets are located on the outlet pipe, the first hole groups are located on an opposite side to the second hole groups along a third direction, the third direction is substantially perpendicular to the first direction and the second direction.

2. The manifold of claim 1, wherein:
   each of the first inlet and the first outlet defines a first diameter, each of the second inlet and the second outlet defines a second diameter, the manifold further comprises a plurality of first joints and a plurality of second joints, each one of the first inlets and each one of the first outlets are connected to a corresponding first joint of the plurality of first joints, each one of the second inlets and each one of the second outlets are connected to a corresponding second joint of the plurality of second joints.

3. The manifold of claim 2, wherein:
   the first diameter is unequal to the second diameter, the manifold further comprises a first adapter, an outer diameter of the first adapter is equal to a larger one of the first diameter and the second diameter, and an inner diameter of the first adapter is equal to a smaller one of the first diameter and the second diameter.

4. The manifold of claim 2, wherein:
   when the first diameter is unequal to the second diameter, the manifold further comprises a second adapter, an outer diameter of the second adapter is equal to a smaller one of the first diameter and the second diameter, and an inner diameter of the second adapter is equal to a larger one of the first diameter and the second diameter.

5. The manifold of claim 2, wherein:
   when the first diameter is equal to the second diameter, a size of the corresponding first joint is the same as a size of the corresponding second joint.

6. The manifold of claim 2, wherein:
   the manifold further comprises a plurality of connecting pieces, each one of the plurality of connecting pieces is configured for connecting, along the second direction, an adjacent pair of the plurality of first joints or an adjacent pair of the plurality of second joints, each one of the plurality of connecting pieces defines two holes, the plurality of first joints or the plurality of second joints are extendable through the two holes of a corresponding connecting piece of the plurality of connecting pieces.

7. The manifold of claim 6, wherein:
   each one of the plurality of connecting pieces further comprises a guide pin on a side away from the inlet pipe and the outlet pipe, the guide pin extends along the third direction and located in a middle of the corresponding connecting piece.

8. A rack configured for liquid cooling comprising:
   a body;
   a swivel joint connected to the body and rotatable around an axis in a first direction; and
   a manifold comprises:
   an inlet pipe, extended along the first direction;
   an outlet pipe, parallel to the inlet pipe and located on one side of the inlet pipe in a second direction, the second direction substantially perpendicular to the first direction;
   a plurality of first hole groups arranged along the first direction at an interval of a first distance therein between; and
   a plurality of second hole groups arranged along the first direction at an interval of a second distance therein between, the second distance being unequal to the first distance; wherein
   the inlet pipe and the outlet pipe are connected to the swivel joint, each one group of the plurality of first hole groups includes a first inlet and a first outlet, each one group of the plurality of second hole groups includes a second inlet and a second outlet, the first inlets and the second inlets are located on the inlet pipe, the first outlets and the second outlets are located on the outlet pipe, the first hole groups are located on an opposite side to the second hole groups along a third direction, the third direction is substantially perpendicular to the first direction and the second direction.

9. The rack of claim 8, wherein:
   each of the first inlet and the first outlet defines a first diameter, each of the second inlet and the second outlet defines a second diameter, the manifold further comprises a plurality of first joints and a plurality of second joints, each one of the first inlets and each one of the first outlets are connected to a corresponding first joint of the plurality of first joints, each one of the second inlets and each one of the second outlets are connected to a corresponding second joint of the plurality of second joints.

10. The rack of claim 9, wherein:
    the first diameter is unequal to the second diameter, the manifold further comprises a first adapter, an outer diameter of the first adapter is equal to a larger one of the first diameter and the second diameter, and an inner diameter of the first adapter is equal to a smaller one of the first diameter and the second diameter.

11. The rack of claim 9, wherein:
    the first diameter is unequal to the second diameter, the manifold further comprises a second adapter, an outer diameter of the second adapter is equal to a smaller one of the first diameter and the second diameter, and an inner diameter of the second adapter is equal to a larger one of the first diameter and the second diameter.

12. The rack of claim 9, wherein:
    when the first diameter is equal to the second diameter, a size of the corresponding first joint is the same as a size of the corresponding second joint.

13. The rack of claim 9, wherein:
    the manifold further comprises a plurality of connecting pieces, each one of the plurality of connecting pieces is configured for connecting, along the second direction, an adjacent pair of the plurality of first joints or an adjacent pair of the plurality of second joints, each one of the plurality of connecting pieces defines two holes, the plurality of first joints or the plurality of second joints are extendable through the two holes of a corresponding connecting piece of the plurality of connecting pieces.

14. The rack of claim 13, wherein:
each one of the plurality of connecting pieces further comprises a guide pin on a side away from the inlet pipe and the outlet pipe, the guide pin extends along the third direction and located in a middle of the corresponding connecting piece.

15. A data center cooling system comprising:
a cooler;
a cooling water input pipe;
a hot water output pipe; and
a rack, wherein the rack comprises:
    a body;
    a swivel joint connected to the body and rotatable around an axis in a first direction; and
    a manifold, wherein the manifold comprises:
        an inlet pipe, extended along the first direction;
        an outlet pipe, parallel to the inlet pipe and located on one side of the inlet pipe in a second direction substantially perpendicular to the first direction;
        a plurality of first hole groups arranged along the first direction at intervals of a first distance; and
        a plurality of second hole groups arranged along the first direction at intervals of a second distance unequal to the first distance, wherein
        the cooling water input pipe and the hot water output pipe are connected to the swivel joint, the inlet pipe and the outlet pipe are connected to the swivel joint, cooling water input pipe inputs cooling water into the inlet pipe, the hot water output pipe output hot water from the outlet pipe, the cooler is configured for cooling the hot water from the hot water output pipe, and
        wherein each one of the plurality of first hole groups includes a first inlet and a first outlet, each one of the plurality of second hole groups includes a second inlet and a second outlet, the first inlets and the second inlets are located on the inlet pipe, the first outlets and the second outlets are located on the outlet pipe, the first hole groups are located on an opposite side to the second hole groups along a third direction, the third direction is substantially perpendicular to the first direction and the second direction.

16. The data center cooling system of claim 15, wherein:
each of the first inlet and the first outlet defines a first diameter, each of the second inlet and the second outlet defines a second diameter, the manifold further comprises a plurality of first joints and a plurality of second joints, each one of the first inlets and each one of the first outlets are connected to a corresponding first joint of the plurality of first joints, each one of the second inlets and each one of the second outlets are connected to a corresponding second joint of the plurality of second joints.

17. The data center cooling system of claim 16, wherein:
the first diameter is unequal to the second diameter, the manifold further comprises a first adapter, an outer diameter of the first adapter is equal to a larger one of the first diameter and the second diameters, and an inner diameter of the first adapter is equal to a smaller one of the first diameter and the second diameter.

18. The data center cooling system of claim 16, wherein:
the first diameter is unequal to the second diameter, the manifold further comprises a second adapter, an outer diameter of the second adapter is equal to a smaller one of the first diameter and the second diameter, and an inner diameter of the second adapter is equal to a larger one of the first diameter and the second diameter.

* * * * *